US007378865B2

(12) United States Patent
Taguchi et al.

(10) Patent No.: US 7,378,865 B2
(45) Date of Patent: May 27, 2008

(54) SUPERCONDUCTING CIRCUIT FOR GENERATING PULSE SIGNAL

(75) Inventors: Atsushi Taguchi, Gunnma (JP); Takuya Himi, Kanagawa (JP); Hideo Suzuki, Kanagawa (JP); Akira Yoshida, Kanagawa (JP); Keiichi Tanabe, Ibaraki (JP)

(73) Assignees: Fujitsu Limited, Kawasaki (JP); International Superconductivity Technology Center, The Juridical Foundation, Tokyo (JP)

( * ) Notice: Subject to any disclaimer, the term of this patent is extended or adjusted under 35 U.S.C. 154(b) by 56 days.

(21) Appl. No.: 11/514,322

(22) Filed: Sep. 1, 2006

(65) Prior Publication Data

US 2007/0052441 A1    Mar. 8, 2007

(30) Foreign Application Priority Data

Sep. 5, 2005    (JP)    ............................ 2005-256585

(51) Int. Cl.
*H03K 19/195* (2006.01)
(52) U.S. Cl. .................. 326/4; 326/1; 326/2; 326/3
(58) Field of Classification Search ................ 326/1–4; 365/160–162
See application file for complete search history.

(56) References Cited

U.S. PATENT DOCUMENTS 6,154,044 A * 11/2000 Herr ............................ 326/1

6,229,332 B1 * 5/2001 Herr ............................ 326/1

OTHER PUBLICATIONS

A. Yoshida et al.; "Frequency Multiply Circuit for Superconducting A/D Converter," IEEE Transactions on Applied Superconductivity, vol. 15, No. 2, Jun. 2005, pp. 431-434.
J. C. Lin et al.; "Design of SFQ-Counting Analog-to-Digital Converter," IEEE Transactions on Applied Superconductivity, vol. 5, No. 2, Jun. 1995, pp. 2252-2259.

* cited by examiner

*Primary Examiner*—Vibol Tan
*Assistant Examiner*—Dylan White
(74) *Attorney, Agent, or Firm*—Kratz, Quintos & Hanson, LLP (57) ABSTRACT

A superconducting circuit includes a first transformer to produce a first alternating-current output at a secondary-side inductor, a second transformer to produce a second alternating-current output at a secondary-side inductor, a first pulse generating circuit to produce a single flux quantum pulse responsive to the first alternating-current output, a second pulse generating circuit to produce a single flux quantum pulse responsive to the second alternating-current output, and a confluence buffer circuit to merge the single flux quantum pulses from the pulse generating circuits, wherein each of the pulse generating circuits includes a superconducting loop including the secondary-side inductor, a first Josephson junction situated in the superconducting loop to generate the single flux quantum pulse, and a second Josephson junction situated in the superconducting loop, a threshold value of the second Josephson junction for an electric current flowing through the secondary-side inductor being different from that of the first Josephson junction.

5 Claims, 8 Drawing Sheets

SUPERCONDUCTING CIRCUIT FOR GENERATING PULSE SIGNAL

CROSS-REFERENCE TO RELATED APPLICATIONS

The present application is based upon and claims the benefit of priority from the prior Japanese Patent Application No. 2005-256585 filed on Sep. 5, 2005, with the Japanese Patent Office, the entire contents of which are incorporated herein by reference.

BACKGROUND OF THE INVENTION

1. Field of the Invention

The present invention generally relates to superconducting circuits utilizing a single flux quantum, and particularly relates to a superconducting circuit that generates a high-frequency clock through frequency multiplication.

2. Description of the Related Art

As a macroscopic quantum effect of superconductor, a loop formed by superconductor results in magnetic flux being quantized within the loop. The minimum unit of magnetic flux that is quantized in superconductor is called an SFQ (single flux quantum). An SFQ circuit is a logic circuit that operates with magnetic flux quantum serving as information carriers. Logic "1" is represented by a state in which an SFQ is present in a superconducting loop including two Josephson junctions, and logic "0" is represented by a state in which an SFQ is absent.

A number of superconducting loops, each of which is the basic structure of the SFQ circuit, are connected together to form a ladder-type line comprised of superconductors and Josephson junctions. This is called a JTL (Josephson transmission line), and allows magnetic flux quantum to propagate. An SFQ generated in a given loop causes the switching of a next Josephson device, resulting in an SFQ being generated in the next loop. This chain reaction allows an SFQ to propagate. In this manner, various logic circuits such as flip flops or the like can be formed by use of the SFQ circuit. It is expected that such SFQ circuit is applicable to various analog/digital processing circuits, including circuits having analog circuit elements, such as A/D converters for use for high-speed signals or small-level signals and superconducting samplers for detecting high-speed signals.

These superconducting analog/digital circuits need a clock signal having high frequency with high precision. In order to provide a sigma-delta A/D converter of a superconductor/semiconductor-hybrid type capable of processing 14-bit data with a frequency band of 10 MHz, for example, a sampling clock signal having a frequency of 20 GHz with a jitter smaller than 2 ps is required.

It is difficult, however, to supply a high-frequency signal from a semiconductor circuit operating in a room temperature environment to a superconducting circuit operating in a low temperature environment. This is because the signal line is required to have a long length and a narrow width in order to suppress heat propagation through the signal line, and it is difficult for the high-frequency signal to propagate through such a signal line.

Accordingly, it is preferable to supply a low frequency signal from the external to the superconducting circuit and to step up the frequency inside the superconducting circuit, rather than supplying a high-frequency signal directly from the external to the superconducting circuit. For example, a 10-GHz sinusoidal wave signal may be supplied from the external, and a doubler circuit may be provided inside the superconducting circuit chip to generate a 20-GHz clock pulse signal.

As a frequency-multiplier circuit implemented by use of a superconducting circuit, a ladder+conditioner circuit (Non-Patent Document 1) and a frequency multiplier (Non-Patent Document 2) are known. The ladder+conditioner circuit has a configuration in which a ladder circuit having a multiple stages of JTL circuits is combined with a JTL-based conditioner circuit. A pulse signal supplied as an input is delayed by the JTL circuit provided at each stage of the ladder circuit, and the plurality of pulse signals having respective delays are superimposed one over another. Then, the conditioner circuit performs an adjustment such that the intervals of the pulses of the superimposed pulse signals become equal to each other. It is difficult, however, to provide a delay with high precision for the JTL at each stage of the ladder circuit, and, also, there is a limit to the capability of the conditioner circuit to adjust the pulse intervals. It is thus difficult to set the pulse intervals to equal length with high precision.

Figure 1:
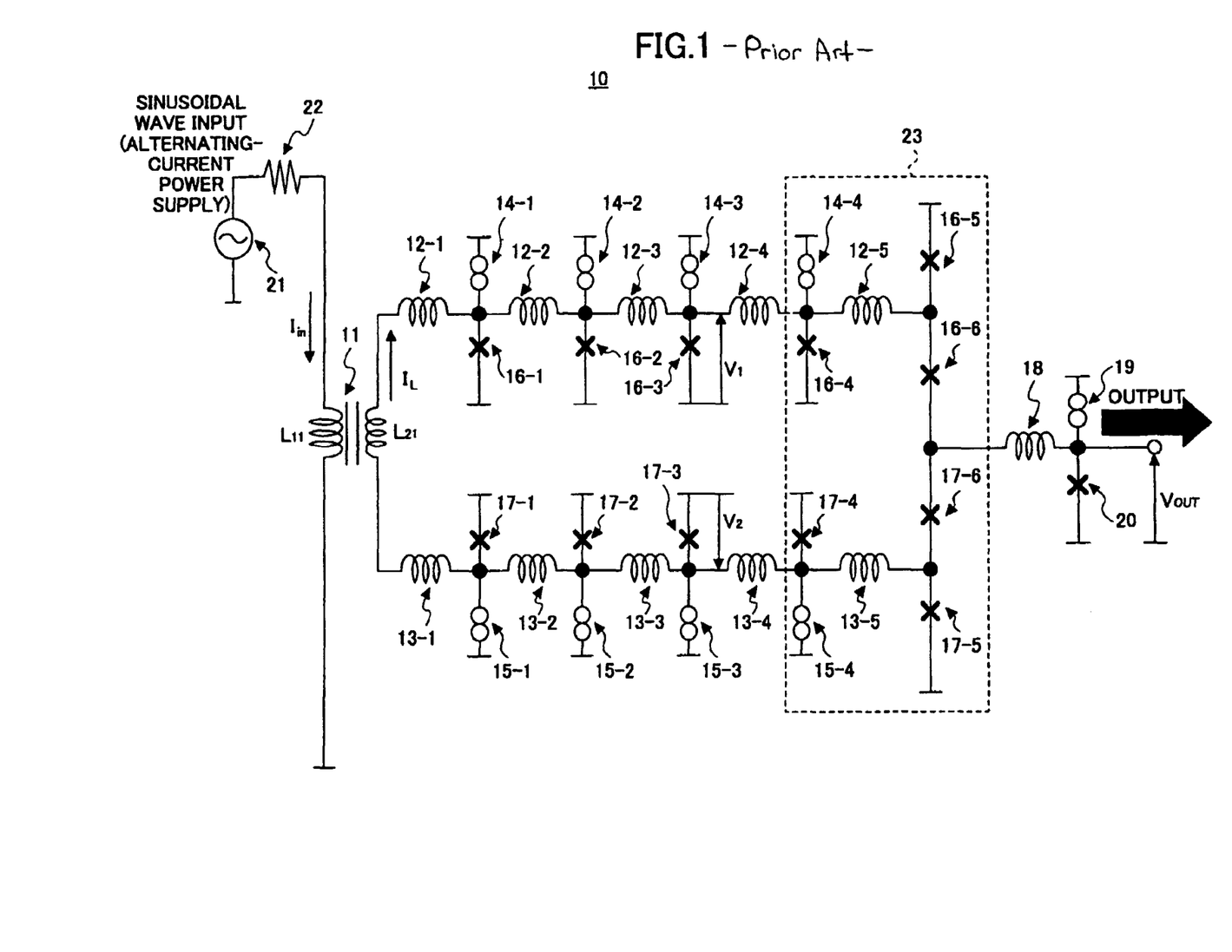
FIG. 1 is a drawing showing an example of the circuit configuration of a related-art frequency multiplier.

The frequency multiplier is a circuit that steps up frequency based on a phase change brought about by utilizing a transformer coupling. FIG. 1 is a drawing showing an example of the circuit configuration of a related-art frequency multiplier.

A frequency multiplier 10 shown in FIG. 1 includes a transformer circuit 11, inductors 12-1 through 12-5, inductors 13-1 through 13-5, current sources 14-1 through 14-4, current sources 15-1 through 15-4, Josephson junctions 16-1 through 16-6, Josephson junctions 17-1 through 17-6, an inductor 18, a current source 19, and a Josephson junction 20. The primary-side inductor $L_{11}$ of the transformer circuit 11 receives a sinusoidal electric current $I_{in}$ from an alternating-current power supply 21 through a resistor 22.

In response, the secondary-side inductor $L_{21}$ of the transformer circuit 11 generates a sinusoidal electric current $I_L$, which initially runs in the direction shown by an arrow illustrated in FIG. 1. When the sum of the bias current supplied from the current source 14-1 to the Josephson junction 16-1 and the sinusoidal electric current $I_L$ exceeds a critical current, the Josephson junction 16-1 is switched on to generate an SFQ pulse. This pulse causes the Josephson junction 16-2 at the next stage to be switched on to generate an SFQ pulse. In this manner, pulses successively propagate to next stages.

When the phase of the sinusoidal electric current $I_{in}$ supplied from the alternating-current power supply 21 advances to π, the sinusoidal electric current $I_L$ generated by the secondary-side inductor $L_{21}$ of the transformer circuit 11 flows in the direction opposite the direction of the illustrated arrow. When the sum of the bias current supplied from the current source 15-1 to the Josephson junction 17-1 and the sinusoidal electric current $I_L$ exceeds a critical current, the Josephson junction 17-1 is switched on to generate an SFQ pulse. This pulse causes the Josephson junction 17-2 at the next stage to be switched on to generate an SFQ pulse. In this manner, pulses successively propagate to next stages.

The pulses propagating through the upper circuit of the frequency multiplier 10 and the pulses propagating through the lower circuit of the frequency multiplier 10 merge at a confluence buffer circuit 23. The Josephson junction 20 is switched by the merged signal, and the voltage generated by this switching is supplied as an output voltage $V_{OUT}$.

In the above description, for the sake of convenience of explanation, switching is explained to occur in response to the sum of the bias current and the sinusoidal electric current $I_L$ exceeding the critical current of the Josephson junction. In reality, however, a magnetic flux quantum is generated due to the switching of the Josephson junction, such that a circulating current is generated and superimposed on the sinusoidal electric current $I_L$. Because of this, the actual operation of the frequency multiplier 10 is slightly different from the above description. As a result, a problem occurs in that the pulse intervals are not set to equal intervals.

Figure 2:
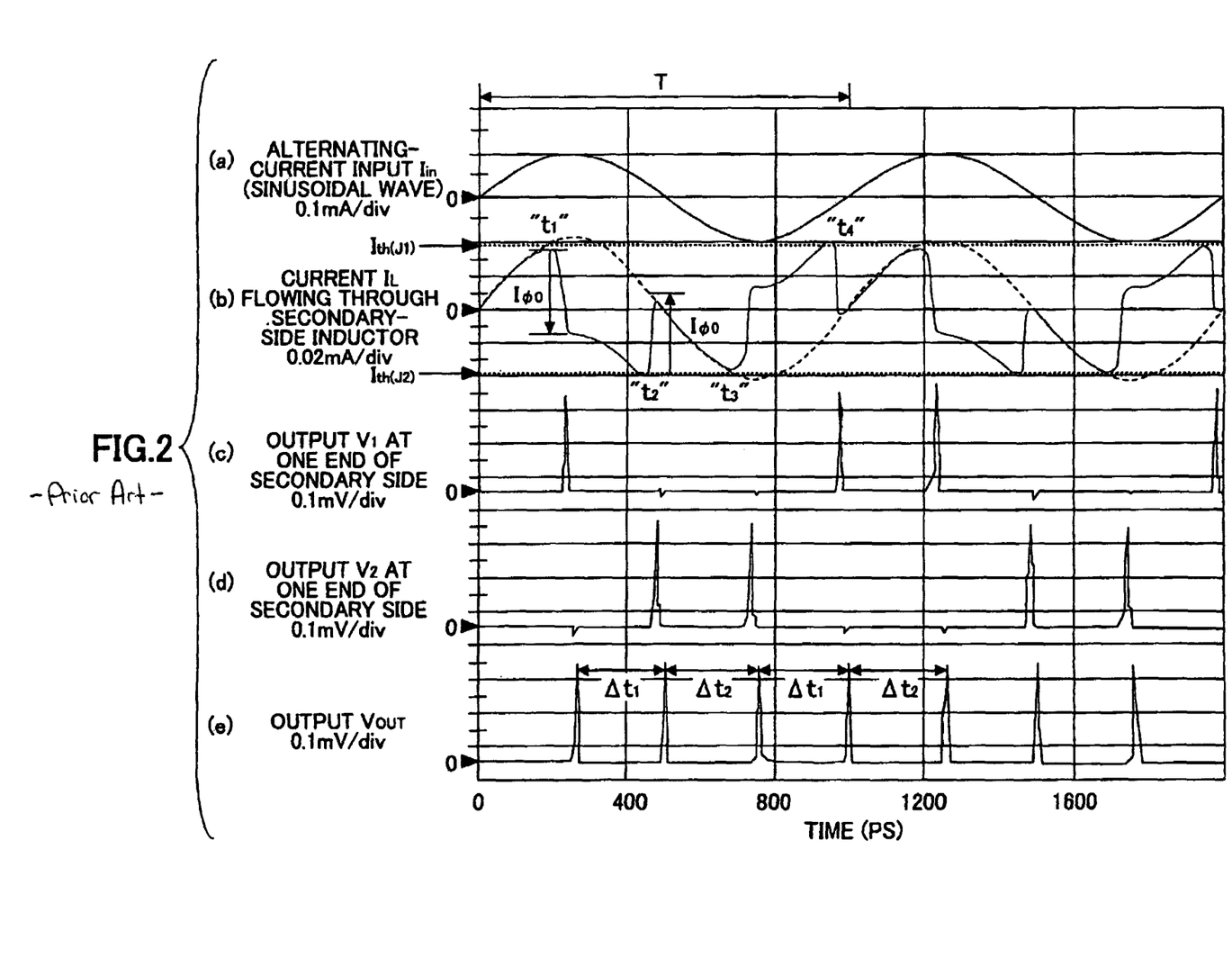
FIG. 2 is a drawing showing waveforms relating to the operation of the frequency multiplier shown in FIG. 1.

FIG. 2 is a drawing showing waveforms relating to the operation of the frequency multiplier 10 shown in FIG. 1. The letter designation (a) in FIG. 2 shows the alternating current $I_{in}$ supplied to the primary-side inductor $L_{11}$ of the transformer circuit 11. The letter designation (b) shows the current $I_L$ flowing through the secondary-side inductor $L_{21}$ of the transformer circuit 11. The waveform illustrated by the dotted line in (b) is the sinusoidal electric current generated by the secondary-side inductor $L_{21}$. The waveform illustrated by the solid line in (b) is the sum of the sinusoidal electric current shown by the dotted line and an electric current $I_{\Phi_0}$ generated by the magnetic flux quantum generated by the switching of the Josephson junction. Accordingly, the current $I_L$ flowing through the secondary-side inductor $L_{21}$ of the transformer circuit 11 has the waveform as shown by the solid line.

In the frequency multiplier 10 shown in FIG. 1, the upper circuit and lower circuit connected to the respective ends of the secondary-side inductor $L_{21}$ of the transformer circuit 11 need to have symmetrical structures in order to generate pulses at equal intervals. As shown in FIG. 2-(b), therefore, a threshold current (critical current) $I_{th(J1)}$ of the Josephson junction 16-1 and a threshold current $I_{th(J2)}$ of the Josephson junction 17-1 have the same magnitude (with opposite signs reflecting their opposite current directions).

As shown in FIG. 2-(b), the initial state (the state in which no magnetic flux quantum is present) lasts until time t1, and, in this state, the current $I_L$ flowing through the secondary-side inductor $L_{21}$ is equal to the sinusoidal electric current illustrated by the dotted line. At the time t1, the current $I_L$ exceeds the threshold current $I_{th(J1)}$ (which is the threshold current for the current $I_L$, and includes the contribution from the bias current supplied from the current source 14-1). In response, the Josephson junction 16-1 is switched on such that a magnetic flux quantum is generated in the superconducting closed loop including the inductor $L_{21}$, thereby generating a circulating current $I_{\Phi_0}$ flowing counterclockwise in the loop. The current $I_L$ running through the secondary-side inductor $L_{21}$ is thus deviated from the sinusoidal electric current by the amount equal to the circulating current $I_{\Phi_0}$. Also, the pulse generated by the switching of the Josephson junction 16-1 propagates through the circuit, so that the voltage V1 shown in the upper circuit of FIG. 1 exhibits a pulse-like change (i.e., an SFQ pulse) as shown in FIG. 2-(c).

Thereafter, at the time t2, the current $I_L$ exceeds the threshold current $I_{th(J2)}$ (which is the threshold current for the current $I_L$, and includes the contribution from the bias current supplied from the current source 15-1). In response, the Josephson junction 17-1 is switched on such that a magnetic flux quantum is generated in the superconducting closed loop including the inductor $L_{21}$, thereby generating a circulating current $I_{\Phi_0}$ flowing clockwise in the loop. The current $I_L$ flowing through the secondary-side inductor $L_{21}$ is thus shifted by the amount equal to the circulating current $I_{\Phi_0}$ so as to return to the magnitude equal to the sinusoidal electric current. The magnetic flux quantum generated at the time t1 and the magnetic flux quantum generated at the time t2 are canceled with each other, resulting in the state in which no magnetic flux quantum is present. Also, the pulse generated by the switching of the Josephson junction 17-1 propagates through the circuit, so that the voltage V2 shown in the lower circuit of FIG. 1 exhibits a pulse-like change as shown in FIG. 2-(d).

At time t3, the current $I_L$ exceeds the threshold current $I_{th(J2)}$. In response, the Josephson junction 17-1 is switched on such that a magnetic flux quantum is generated in the superconducting closed loop including the inductor $L_{21}$, thereby generating a circulating current $I_{\Phi_0}$ flowing clockwise in the loop. The current $I_L$ flowing through the secondary-side inductor $L_{21}$ is thus deviated from the sinusoidal electric current by the amount equal to the circulating current $I_{\Phi_0}$. Because of the associated pulse propagation, the voltage V2 shown in FIG. 2-(d) exhibits a further pulse-like change.

At time t4, the current $I_L$ exceeds the threshold current $I_{th(J1)}$. In response, the Josephson junction 16-1 is switched on such that a magnetic flux quantum is generated in the superconducting closed loop including the inductor $L_{21}$, thereby generating a circulating current $I_{\Phi_0}$ flowing counterclockwise in the loop. The current $I_L$ flowing through the secondary-side inductor $L_{21}$ is thus shifted by the amount equal to the circulating current $I_{\Phi_0}$ so as to return to the magnitude equal to the sinusoidal electric current. The magnetic flux quantum generated at the time t3 and the magnetic flux quantum generated at the time t4 are canceled with each other, resulting in the state in which no magnetic flux quantum is present. Because of the associated pulse propagation, the voltage V1 shown in FIG. 2-(c) exhibits a further pulse-like change.

In the manner as described above, four pulses are generated at timings t1, t2, t3, and t4 during one cycle T of the input sinusoidal wave. These pulses are merged at the confluence buffer circuit 23, so that the output voltage $V_{OUT}$ exhibits a waveform as shown in FIG. 2-(e). In this output voltage $V_{OUT}$, the time intervals between the pulses are $\Delta t1$, $\Delta t2$, $\Delta t1$, $\Delta t2$, and so on.

The pulse at the time t1 and the pulse at the time t3 are generated at the timing dependent on the waveform of the sinusoidal electric current as shown in FIG. 2-(b), so that these pulses are distanced from each other by half a cycle of the sinusoidal wave. Accordingly, there is no problem with the precision of the timing of these pulses. Namely, $\Delta t1 + \Delta t2$ is equal to half the cycle of the input sinusoidal wave in FIG. 2-(e).

The pulse at the time t2 and the pulse at the time t4 are generated at the timing dependent on the waveform made by superimposing the circulating current $I_{\Phi_0}$ on the sinusoidal electric current as shown in FIG. 2-(b). Accordingly, the interval between the pulse at the time t1 and the pulse at the time t2 as well as the interval between the pulse at the time t3 and the pulse at the time t4 are independent of the input sinusoidal wave. Namely, $\Delta t1$ and $\Delta t2$ shown in FIG. 2-(e) are not individually a quarter of one cycle of the input sinusoidal wave, but are independent of the cycle of the input sinusoidal wave. Further, the magnitude of the circulating current $I_{\Phi_0}$ fluctuates depending on the circuit parameters, so that it is difficult to set the timing of the t2 pulse and t4 pulse with sufficient precision.

In this manner, it is difficult for the related-art frequency multiplier to generate a signal having pulses at equal intervals.

[Non-Patent Document 1] A. Yoshida et al, "Frequency Multiply Circuit for Superconducting A/D Converter," IEEE Transactions on Applied Superconductivity, Vol. 15, No. 2, pp 431-434 (2005)

[Non-Patent Document 2] J. C. Lin et al, "Design of SFQ-Counting Analog-to-Digital Converter," IEEE Transactions on Applied Superconductivity, Vol. 5, No. 2, pp 2252-2259 (1995)

Accordingly, there is a need for a superconducting-circuit-based clock generating circuit that can generate a clock signal with high precision and small jitter.

SUMMARY OF THE INVENTION

It is a general object of the present invention to provide a superconducting-circuit-based clock generating circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a superconducting-circuit-based clock generating circuit particularly pointed out in the specification in such full, clear, concise, and exact terms as to enable a person having ordinary skill in the art to practice the invention.

To achieve these and other advantages in accordance with the purpose of the invention, the invention provides a superconducting circuit, which includes a first transformer to receive an alternating-current input at a primary-side inductor and to produce a first alternating-current output at a secondary-side inductor, a second transformer to receive the alternating-current input at a primary-side inductor and to produce a second alternating-current output at a secondary-side inductor, a first pulse generating circuit coupled to the secondary-side inductor of the first transformer to produce at an output node a single flux quantum pulse responsive to the first alternating-current output, a second pulse generating circuit coupled to the secondary-side inductor of the second transformer to produce at an output node a single flux quantum pulse responsive to the second alternating-current output, and a confluence buffer circuit coupled to the output node of the first pulse generating circuit and the output node of the second pulse generating circuit to produce a pulse signal made by merging the single flux quantum pulse from the first pulse generating circuit and the single flux quantum pulse from the second pulse generating circuit, wherein each of the first pulse generating circuit and the second pulse generating circuit includes a superconducting loop including the secondary-side inductor, a first Josephson junction situated in the superconducting loop to generate the single flux quantum pulse, and a second Josephson junction situated in the superconducting loop, a threshold value of the second Josephson junction for an electric current flowing through the secondary-side inductor being different from that of the first Josephson junction.

According to at least one embodiment of the present invention, a first Josephson junction and second Josephson junction having different threshold values are provided in a superconducting loop, with one of the junctions being used to preset a single flux quantum and the other junction being used to reset the single flux quantum. Provision of different threshold values between the first Josephson junction and the second Josephson junction makes it possible that each Josephson junction is switched on only once in one cycle of the alternating-current input to generate a single flux quantum. Accordingly, pulses at equal intervals can be produced by extracting as an output the single flux quantum pulses generated by the first Josephson junction. Further, the pulses of the first pulse generating circuit and the pulses of the second pulse generating circuit may be merged to generate a high-speed clock signal having double the frequency of the alternating-current input. With this provision, it is possible to provide a high-speed clock signal made by stepping up the input frequency as a clock signal having high precision and small jitter.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 3:
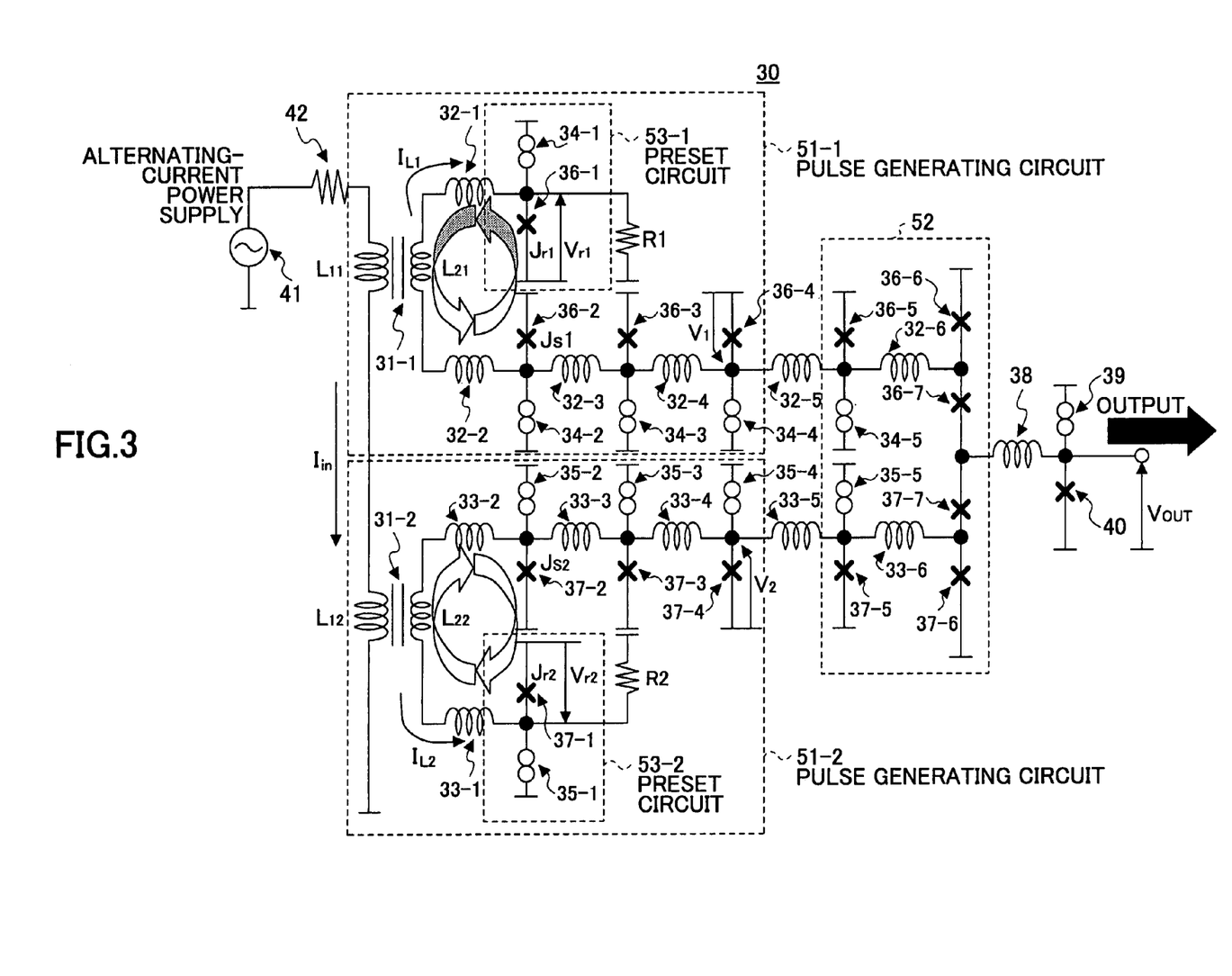
FIG. 3 is a drawing showing the configuration of an embodiment of a clock generating circuit according to the present invention.

FIG. 3 is a drawing showing the configuration of an embodiment of a clock generating circuit according to the present invention. A clock generating circuit 30 shown in FIG. 3 includes a transformer circuit 31-1, a transformer circuit 31-2, inductors 32-1 through 32-6, inductors 33-1 through 33-6, bias-purpose current sources 34-1 through 34-5, bias-purpose current sources 35-1 through 35-5, Josephson junctions 36-1 through 36-7, Josephson junctions 37-1 through 37-7, a resistor R1, a resistor R2, an inductor 38, a bias-purpose current source 39, and a Josephson junction 40. The primary-side inductor $L_{11}$ of the transformer circuit 31-1 and the primary-side inductor $L_{12}$ of the transformer circuit 31-2 receive a sinusoidal electric current $I_{in}$ from an alternating-current power supply 41 through a resistor 42.

The transformer circuit 31-1, the inductors 32-1 through 32-4, the current sources 34-1 through 34-4, the Josephson junctions 36-1 through 36-4, and the resistor R1 together constitute a first pulse generating circuit 51-1. Further, the transformer circuit 31-2, the inductors 33-1 through 33-4, the current sources 35-1 through 35-4, the Josephson junctions 37-1 through 37-4, and the resistor R2 together constitute a second pulse generating circuit 51-2. The inductor 32-6, the inductor 33-6, the current source 34-5, the current source 35-5, the Josephson junctions 36-5 through 36-7, and the Josephson junctions 37-5 through 37-7 together constitute a confluence buffer 52.

In the clock generating circuit 30 shown in FIG. 3, the pulse generating circuit 51-1 generates first pulses at intervals equal to one cycle of the input sinusoidal electric current $I_L$ supplied from the alternating-current power supply 41, and the pulse generating circuit 51-2 generates second pulses at intervals equal to one cycle of the input sinusoidal electric current $I_L$ with a timing displacement equal to half the cycle from the first pulses. The first pulses and the second pulses are merged by the confluence buffer circuit 52 to become an output clock signal.

In the pulse generating circuit 51-1, the Josephson junction 36-1 (Jr1) and the current source 34-1 together constitute a preset circuit 53-1. In the pulse generating circuit 51-2, the Josephson junction 37-1 (Jr2) and the current source 35-1 together constitute a preset circuit 53-2.

The preset circuit 53-1 of the pulse generating circuit 51-1 serves to preset a magnetic flux quantum in the superconducting closed loop including the secondary-side inductor $L_{21}$ of the transformer circuit 31-1. Thereafter, the Josephson junction 36-2 serves to generate a magnetic flux quantum in the opposite direction in this superconducting closed loop to create a state in which no magnetic flux quantum is present. Also, the associated pulse is made to propagate through the pulse generating circuit 51-1 such as to be output as a voltage V1. In so doing, provision may be made such that the threshold current $I_{th(Jr1)}$ of the Josephson junction 36-1 (Jr1) and the threshold current $I_{th(Js1)}$ of the Josephson junction 36-2 (Js1) are selected as different values, thereby outputting only one pulse in one cycle of the input sinusoidal wave from the pulse generating circuit 51-1. By the same token, provision may be made such that the threshold current $I_{th(Jr2)}$ of the Josephson junction 37-1 (Jr2) and the threshold current $I_{th(Js2)}$ of the Josephson junction 37-2 (Js2) are selected as different values, thereby outputting only one pulse in one cycle of the input sinusoidal wave from the pulse generating circuit 51-2.

In the related-art frequency multiplier 10 shown in FIG. 1, the threshold current $I_{th(J1)}$ of the Josephson junction 16-1 and the threshold current $I_{th(J2)}$ of the Josephson junction 17-1 need to have the same magnitude. Because of this, the upper circuit generates two pulses in one cycle, and the lower circuit also generates two pulses in one cycle, giving rise to a problem in that some of the pulses are independent of the cycle of the input sinusoidal wave. In the clock generating circuit 30 of the present invention shown in FIG. 3, the preset circuit is provided, and the threshold voltage of the Josephson junction of this preset circuit is set to a different value than the threshold voltage of the Josephson junction of the circuit that generates a pulse to propagate. This can suppress the generation of pulses that are independent of the cycle of the input sinusoidal wave.

Further, a direct-current power supply (now shown in FIG. 3) may be added in series to the alternating-current power supply 41 to adjust the direct-current offset level, thereby correcting variation created in the manufacturing process of the superconducting circuit. This makes it possible to adjust the intervals of the generated pulses to achieve equal intervals.

Figure 4:
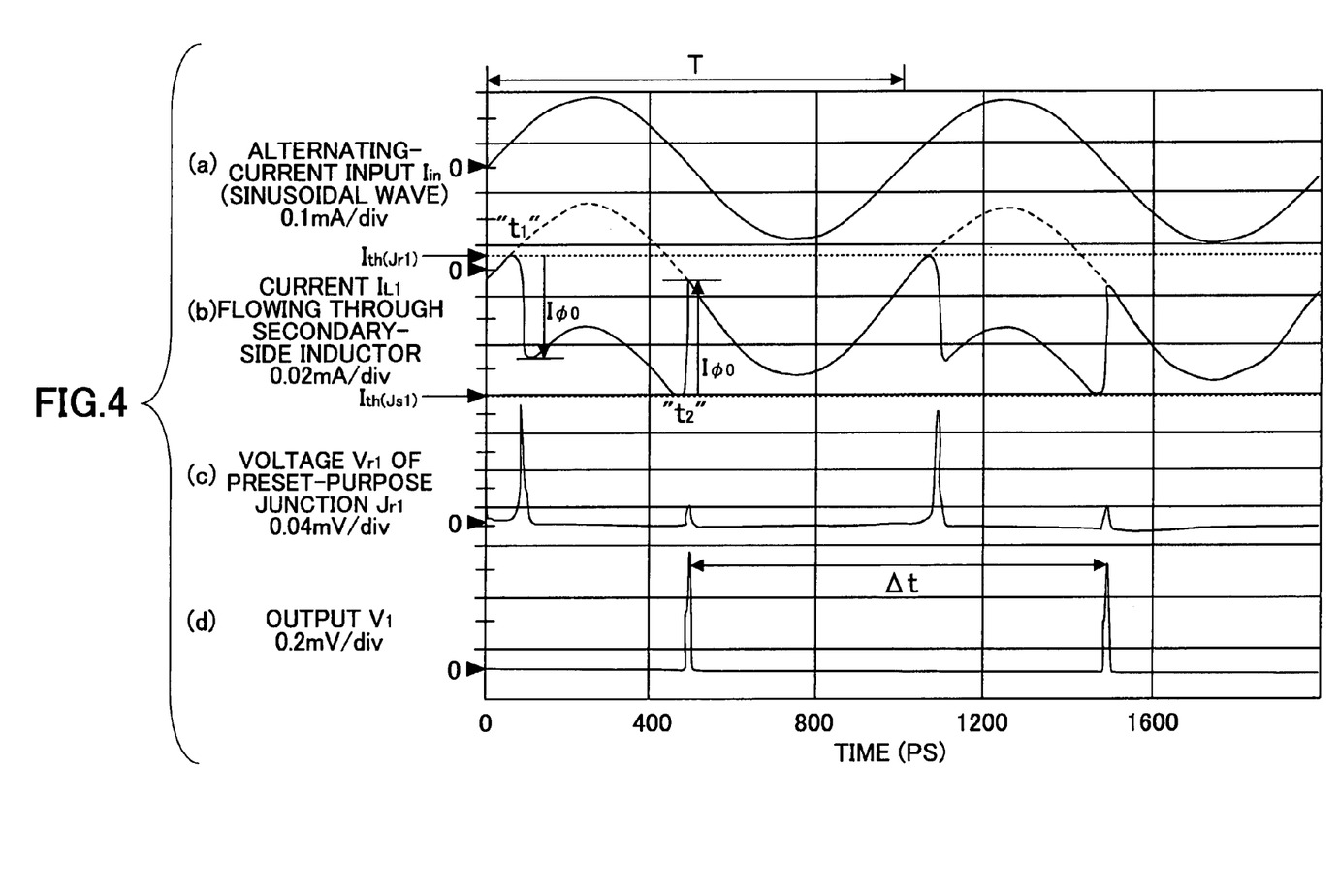
FIG. 4 is a drawing showing signal waveforms for explaining the operation of the pulse generating circuit shown in FIG. 3.

FIG. 4 is a drawing showing signal waveforms for explaining the operation of the pulse generating circuit 51-1 shown in FIG. 3. The letter designation (a) in FIG. 4 shows the alternating current $I_{in}$ supplied to the primary-side inductor $L_{11}$ of the transformer circuit 31-1. The letter designation (b) shows the current $I_{L1}$ flowing through the secondary-side inductor $L_{21}$ of the transformer circuit 31-1. The waveform illustrated by the dotted line in (b) is the sinusoidal electric current generated by the secondary-side inductor $L_{21}$. The waveform illustrated by the solid line in (b) is the sum of the sinusoidal electric current shown by the dotted line and an electric current $I_{\Phi_0}$ generated by the magnetic flux quantum generated by the switching of the Josephson junction. Accordingly, the current $I_{L1}$ flowing through the secondary-side inductor $L_{21}$ of the transformer circuit 31-1 has the waveform as shown by the solid line.

In the pulse generating circuit 51-1 shown in FIG. 3, provision is made as described above such that the threshold current $I_{th(Jr1)}$ of the Josephson junction 36-1 (Jr1) and the threshold current $I_{th(Js1)}$ of the Josephson junction 36-2 (Js1) are selected as different values. In the example shown in FIG. 4-(b), the threshold current $I_{th(Jr1)}$ is set to a significantly smaller value than is the threshold current $I_{th(Js1)}$ (with an opposite sign reflecting the opposite direction of the electric current).

As shown in FIG. 4-(b), the initial state (the state in which no magnetic flux quantum is present) lasts until time t1, and, in this state, the current $I_{L1}$ flowing through the secondary-side inductor $L_{21}$ is equal to the sinusoidal electric current illustrated by the dotted line. At the time t1, the current $I_{L1}$ exceeds the threshold current $I_{th(Jr1)}$ (which is the threshold current for the current $I_{L1}$, and includes the contribution from the bias current supplied from the current source). In response, the Josephson junction 36-1 is switched on such that a magnetic flux quantum is generated in the superconducting closed loop including the inductor $L_{21}$, thereby generating a circulating current $I_{\Phi_0}$ flowing counterclockwise in the loop. The current $I_{L1}$ flowing through the secondary-side inductor $L_{21}$ is thus deviated from the sinusoidal electric current by the amount equal to the circulating current $I_{\Phi_0}$. The pulse generated by the switching of the Josephson junction 36-1 appears as the voltage Vr1 of the Josephson junction 36-1 (Jr1) as shown in FIG. 4-(c), but disappears as it is absorbed by the resistor R1.

Thereafter, at time t2, the current $I_{L1}$ exceeds the threshold current $I_{th(Js1)}$ (which is the threshold current for the current $I_{L1}$, and includes the contribution from the bias current supplied from the current source). In response, the Josephson junction 36-2 is switched on such that a magnetic flux quantum is generated in the superconducting closed loop including the inductor $L_{21}$, thereby generating a circulating current $I_{\Phi_0}$ flowing clockwise in the loop. The current $I_{L1}$ flowing through the secondary-side inductor $L_{21}$ is thus shifted by the amount equal to the circulating current $I_{\Phi_0}$ so as to return to the magnitude equal to the sinusoidal electric current. The magnetic flux quantum generated at the time t1 and the magnetic flux quantum generated at the time t2 are canceled with each other, resulting in the reset state in which no magnetic flux quantum is present. Also, the pulse generated by the switching of the Josephson junction 36-2 propagates through the circuit, so that the output voltage V1 of the pulse generating circuit 51-1 (see FIG. 3) exhibits a pulse-like change (i.e., an SFQ pulse) as shown in FIG. 4-(d).

As shown in FIG. 4-(b), the threshold current $I_{th(Js1)}$ is set larger than the amplitude of the sinusoidal electric current shown by the dotted line, so that the Josephson junction 36-2 (Js1) is not switched on again during the same cycle as the time t2. After the time t2, thus, the Josephson junction 36-1 (Jr1) for the presetting purpose is switched on only after waiting for one cycle to pass from the time t1.

In the manner as described above, two pulses are generated at timings t1 and t2 during one cycle T of the input sinusoidal wave. The pulses generated at the time t2 of the respective cycles are extracted as the output as shown in FIG. 4-(d). Intervals Δt of these pulses are equal to the one cycle T of the input sinusoidal wave. In this example, the pulses generated at the time t2 are extracted as the output. Alternatively, the pulses generated at the time t1 may be extracted as the output.

Figure 5:
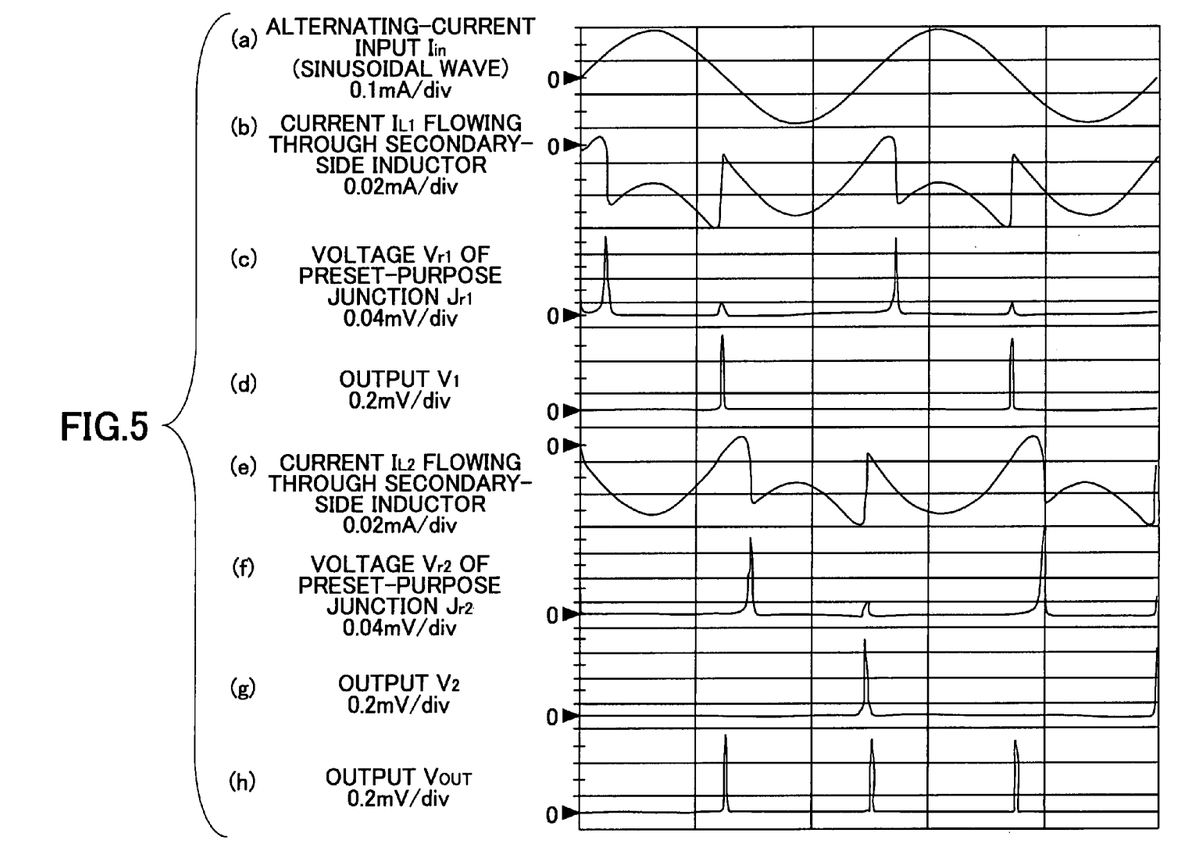
FIG. 5 is a drawing showing signal waveforms illustrating the operation of the clock generating circuit shown in FIG. 3.

FIG. 5 is a drawing showing signal waveforms illustrating the operation of the clock generating circuit 30 shown in FIG. 3. The letter designation (a) shows the alternating current $I_{in}$ supplied to the primary-side inductors of the transformer circuit 31-1 and the transformer circuit 31-2. The letter designation (b) shows the current $I_{L1}$ flowing through the secondary-side inductor $L_{21}$ of the transformer circuit 31-1 in the first pulse generating circuit 51-1. The letter designation (c) shows the voltage Vr1 of the Josephson junction Jr1 (36-1) of the preset circuit 53-1 in the first pulse generating circuit 51-1. The letter designation (d) shows the output voltage V1 of the first pulse generating circuit 51-1.

The letter designation (e) shows the current $I_{L2}$ flowing through the secondary-side inductor $L_{22}$ of the transformer circuit 31-2 in the second pulse generating circuit 51-2. The letter designation (f) shows the voltage Vr2 of the Josephson junction Jr2 (37-1) of the preset circuit 53-2 in the second pulse generating circuit 51-2. The letter designation (g) shows the output voltage V2 of the second pulse generating circuit 51-2. The letter designation (h) shows the output voltage $V_{OUT}$ of the clock generating circuit 30.

The signal waveforms shown in FIG. 5-(a) through (d) are the same as the signal waveforms illustrated in FIG. 4-(a) through (d). As shown in FIG. 5-(d), the first pulse generating circuit 51-1 generates the output voltage V1 as pulse signals appearing at the intervals equal to the one cycle of the input sinusoidal wave.

The second pulse generating circuit 51-2 whose signal waveforms are shown in FIG. 5-(e) through (g) has the same configuration as the first pulse generating circuit 51-1, except that the second pulse generating circuit 51-2 is configured such that its operation responsive to the input sinusoidal wave has an opposite phase to the first pulse generating circuit 51-1. Accordingly, as shown in FIG. 5-(f), the Josephson junction Jr2 (37-1) for the presetting purposes is switched on once in one cycle to generate a pulse. Also, as shown in FIG. 5-(g), one pulse is generated in one cycle as the output voltage V2 of the second pulse generating circuit 51-2.

The output pulse signal of the first pulse generating circuit 51-1 shown in (d) and the output pulse signal of the second pulse generating circuit 51-2 shown in (g) are merged by the confluence buffer circuit 52 into the output voltage $V_{OUT}$ of the clock generating circuit 30. The output of the clock generating circuit 30 is such a signal that the pulse intervals are identical to each other and two pulses occur in one cycle of the input sinusoidal wave. Namely, this circuit functions as a doubler circuit that doubles the frequency of the input signal. It should be noted that, in order to achieve equal pulse intervals in the final output $V_{OUT}$, the first pulse generating circuit 51-1 and the second pulse generating circuit 51-2 need to have the same configuration and the same characteristics.

In the configuration of the present invention described above, the Josephson junction Jr1 (or Jr2) and the Josephson junction Js1 (or Js2) are set to different threshold values. This may be achieved by providing a different setting to either or both of the critical current of the Josephson junction and the bias current. In the clock generating circuit 30 shown in FIG. 3, for example, the Josephson junction Jr1 (or Jr2) for the presetting purpose and the Josephson junction Js1 (or Js2) for the SFQ pulse propagation purpose (resetting purpose) may be configured to have the same critical current (which is the current size that triggers switching), and the bias currents supplied to these junctions may be set differently so as to achieve different threshold values. In such configuration, in order to ensure a stable operation with a wide margin, it is preferable that the bias supplied to the SFQ-pulse-propagation-purpose junction is smaller than the bias supplied to the preset-purpose junction, assuming that the critical currents are the same. With such settings, the preset-purpose junction reaches its trigger point when the sum of its bias current and the sinusoidal electric current generated by the transformer coupling reaches the critical current. The SFQ-pulse-propagation-purpose junction, on the other hand, reaches its trigger point when the sum of its bias current, the sinusoidal electric current generated by the transformer coupling, and the circulating current generated by a magnetic flux quantum generated by the switching of the preset-purpose junction reaches the critical current. Namely, one additional current element exists in the case of the SFQ-pulse-propagation-purpose junction. Because of this, when the critical currents of the respective junctions are the same, the bias current supplied to the SFQ-pulse-propagation-purpose junction is preferably smaller than the bias current supplied to the preset-purpose junction.

In stead of achieving different threshold voltages by setting the bias currents to different values while having the same critical currents between the SFQ-pulse-propagation purpose junction and the preset-purpose junction as described above, the critical currents may be set differently between the SFQ-pulse-propagation purpose junction and the preset-purpose junction. With such configuration, the advantage that pulses are obtained at equal intervals is also achieved.

Figure 6:
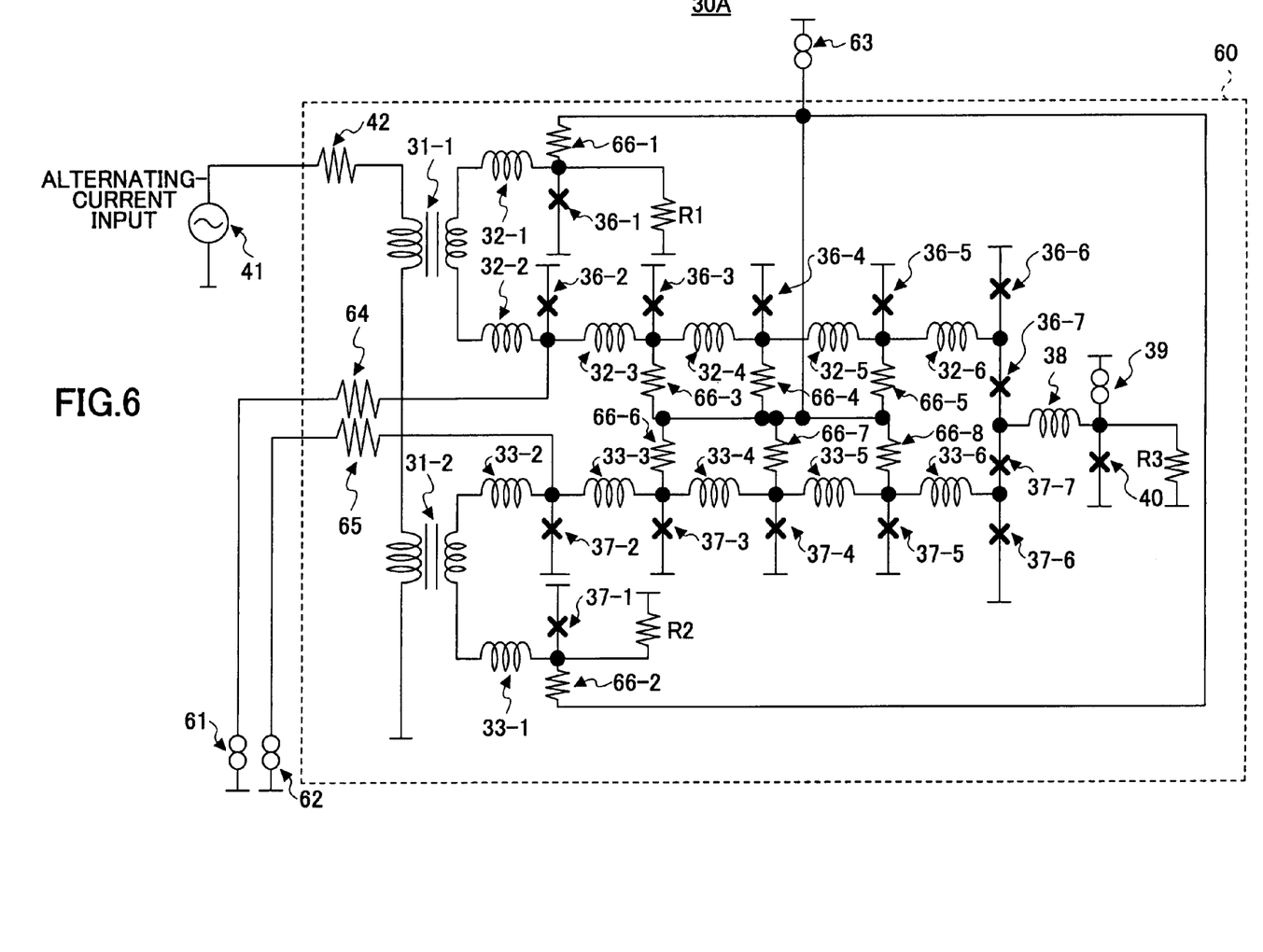
FIG. 6 is a drawing showing the configuration of another embodiment of the clock generating circuit according to the present invention.

FIG. 6 is a drawing showing the configuration of another embodiment of the clock generating circuit according to the present invention. In FIG. 6, the same elements as those of FIG. 3 are referred to by the same numerals, and a description thereof will be omitted.

A clock generating circuit 30A shown in FIG. 6 includes the transformer circuit 31-1, the transformer circuit 31-2, the inductors 32-1 through 32-6, the inductors 33-1 through 33-6, the Josephson junctions 36-1 through 36-7, the Josephson junctions 37-1 through 37-7, the resistor R1, the resistor R2, the inductor 38, the bias-purpose current source 39, the Josephson junction 40, a resistor R3, a resistor 42, a resistor 64, a resistor 65, and resistors 66-1 through 66-8. These elements constitute a superconducting circuit 60, with the alternating-current power supply 41 and bias-purpose current sources 61 through 63 being provided in the periphery.

The primary-side inductor of the transformer circuit 31-1 and the primary-side inductor of the transformer circuit 31-2 receive a sinusoidal electric current externally from the alternating-current power supply 41 through the resistor 42. The Josephson junction 36-2 for the SFQ-pulse-propagation purpose receives a bias current from the current source 61 through the resistor 64. The Josephson junction 37-2 for the SFQ-pulse-propagation purpose receives a bias current from the current source 62 through the resistor 65. The Josephson junctions 36-1 and 37-1 for the preset purpose receive a bias current from the current source 63 through the respective resistors 66-1 and 66-2. Further, the Josephson junctions 36-3 through 36-5 and Josephson junctions 37-3 through 37-5 for the SFQ-pulse-propagation purposes receive a bias current from the current source 63 through the respective resistors 66-3 and 66-5 and resistors 66-6 and 66-8.

In the clock generating circuit 30A shown in FIG. 6 described above, the preset-purpose Josephson junction 36-1 of the first pulse generating circuit and the SFQ-pulse-propagation-purpose Josephson junction 36-2 of the first pulse generating circuit receive their bias currents from the respective, independent current sources 63 and 61, so that these bias currents are settable independently. By the same token, the preset-purpose Josephson junction 37-1 of the second pulse generating circuit and the SFQ-pulse-propagation-purpose Josephson junction 37-2 of the second pulse generating circuit receive their bias currents from the respective, independent current sources 63 and 62, so that these bias currents are settable independently.

With such configuration that each portion receives an independent current, it is possible to adjust the bias current of each portion independently. With such provision, it is possible to correct variation created in the manufacturing process of the superconducting circuit, thereby adjusting the intervals of generated pulses to achieve equal intervals.

Figure 7:
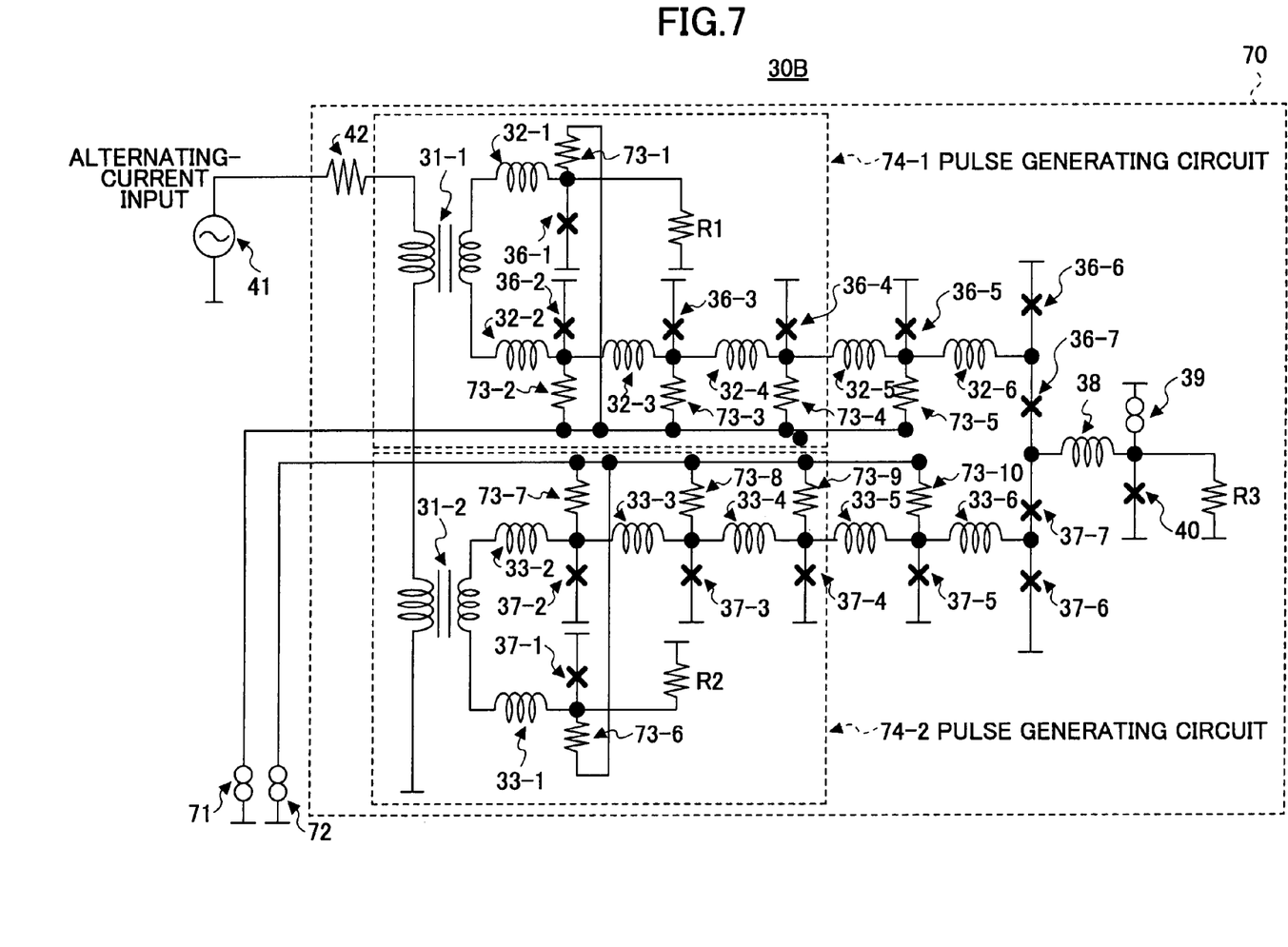
FIG. 7 is a drawing showing the configuration of yet another embodiment of the clock generating circuit according to the present invention.

FIG. 7 is a drawing showing the configuration of yet another embodiment of the clock generating circuit according to the present invention. In FIG. 7, the same elements as those of FIG. 3 are referred to by the same numerals, and a description thereof will be omitted.

A clock generating circuit 30B shown in FIG. 7 includes the transformer circuit 31-1, the transformer circuit 31-2, the inductors 32-1 through 32-6, the inductors 33-1 through 33-6, the Josephson junctions 36-1 through 36-7, the Josephson junctions 37-1 through 37-7, the resistor R1, the resistor R2, the inductor 38, the bias-purpose current source 39, the Josephson junction 40, the resistor R3, the resistor 42, and resistors 73-1 through 73-10. These elements constitute a superconducting circuit 70, with the alternating-current power supply 41 and bias-purpose current sources 71 and 72 being provided in the periphery.

The primary-side inductor of the transformer circuit 31-1 and the primary-side inductor of the transformer circuit 31-2 receive a sinusoidal electric current externally from the alternating-current power supply 41 through the resistor 42. The Josephson junctions 36-1 through 36-4 of a first pulse generating circuit 74-1 shown in FIG. 7 receive a bias current from the current source 71 through the respective resistors 73-1 through 73-4. The Josephson junctions 37-1 through 37-4 of a second pulse generating circuit 74-2 receive a bias current from the current source 72 through the respective resistors 73-6 through 73-9.

In the clock generating circuit 30B shown in FIG. 7 described above, the first pulse generating circuit 74-1 and the second pulse generating circuit 74-2 receive their bias currents from the respective, independent current sources 71 and 72, so that these bias currents are independently settable. With such provision, it is possible to correct variation created in the fabrication process of the superconducting circuit, thereby adjusting the intervals of generated pulses to achieve equal intervals.

Figure 8:
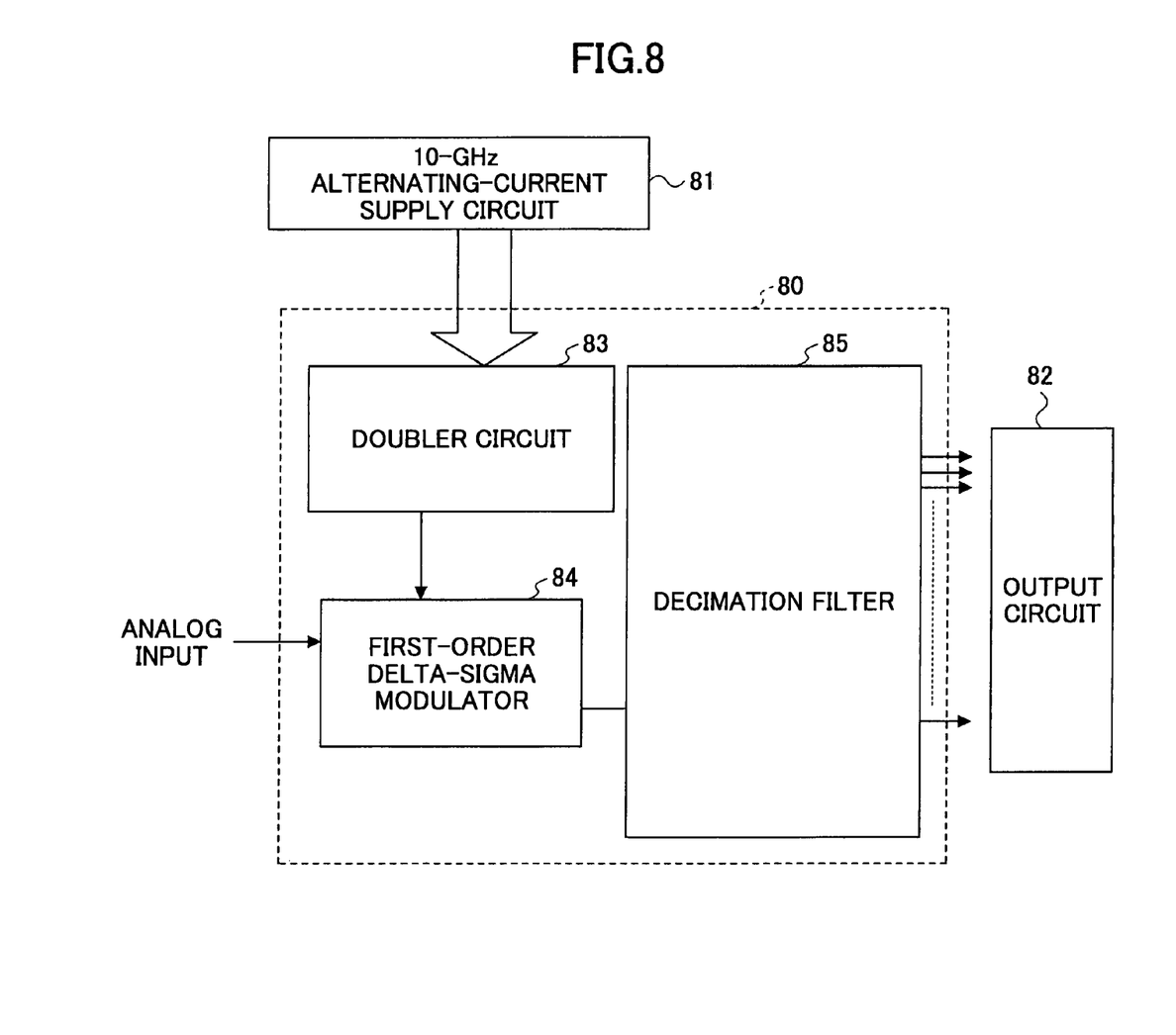
FIG. 8 is a drawing showing the configuration of an example of application of the clock generating circuit according to the present invention.

FIG. 8 is a drawing showing the configuration of an example of application of the clock generating circuit according to the present invention. The circuit of FIG. 8 includes a superconducting A/D converter 80, an alternating-current supply circuit 81, and an output circuit 82. The superconducting A/D converter 80 includes a doubler circuit 83 that is the clock generating circuit of the present invention, a first-order delta-sigma modulator 84, and a decimation filter 85.

The doubler circuit 83 is the clock generating circuit as shown in FIG. 3, FIG. 6, or FIG. 7, and receives a 10-GHz sinusoidal wave signal, for example, supplied from the alternating-current supply circuit 81. The doubler circuit 83 then generates a clock signal having the double frequency (20 GHz) that has two pulses in each cycle of the input signal. The 20-GHz high-speed clock signal generated by the doubler circuit 83 is supplied to the first-order delta-sigma modulator 84. The first-order delta-sigma modulator 84 operates in synchronization with the high-speed clock signal to perform an A/D conversion with respect to its analog input signal. The first-order delta-sigma modulator 84 then outputs a digital code responsive to the analog input voltage as a time sequence of 1-bit output signals. The 1-bit output signals modulated such as to represent the analog input voltage is subjected to an integration process (averaging process) by the decimation filter 85, so that multiple-bit digital data responsive to the analog input voltage is supplied from the decimation filter 85 to the output circuit 82.

With the configuration as described above, a high-speed & high-precision clock signal is generated inside a superconducting circuit, and an A/D converting operation is performed in synchronization with the generated clock signal, thereby providing a delta-sigma-type A/D converter operating at high speed by use of the superconducting circuit. In the example described above, the entirety of the superconducting A/D converter 80 is implemented as a superconducting circuit. Alternatively, the decimation filter 85 may be implemented by use of a semiconductor circuit operating at room temperature, providing a hybrid configuration comprised of a superconducting circuit and a semiconductor circuit.

In the embodiments described above, the input signal was a sinusoidal wave signal, but is not limited to a sinusoidal wave signal. It suffices for the input signal used in the present invention to be an alternating-current signal. For example, the circuits described in connection with the above embodiments will properly operate when a triangular wave signal, a rectangular wave signal, or a pulse signal is used as an input.

Further, the present invention is not limited to these embodiments, but various variations and modifications may be made without departing from the scope of the present invention.

What is claimed is:

1. A superconducting circuit, comprising:
a first transformer to receive an alternating-current input at a primary-side inductor and to produce a first alternating-current output at a secondary-side inductor;
a second transformer to receive the alternating-current input at a primary-side inductor and to produce a second alternating-current output at a secondary-side inductor;
a first pulse generating circuit coupled to the secondary-side inductor of the first transformer to produce at an output node a single flux quantum pulse responsive to the first alternating-current output;
a second pulse generating circuit coupled to the secondary-side inductor of the second transformer to produce at an output node a single flux quantum pulse responsive to the second alternating-current output; and
a confluence buffer circuit coupled to the output node of the first pulse generating circuit and the output node of the second pulse generating circuit to produce a pulse signal made by merging the single flux quantum pulse from the first pulse generating circuit and the single flux quantum pulse from the second pulse generating circuit, wherein each of the first pulse generating circuit and the second pulse generating circuit includes:

a superconducting loop including the secondary-side inductor;

a first Josephson junction situated in the superconducting loop to generate the single flux quantum pulse; and a second Josephson junction situated in the superconducting loop, a threshold value of the second Josephson junction for an electric current flowing through the secondary-side inductor being different from that of the first Josephson junction.

2. The superconducting circuit as claimed in claim 1, wherein at least one of a critical junction current and an applied bias current are different between the first Josephson junction and the second Josephson junction.

3. The superconducting circuit as claimed in claim 2, wherein a path for supplying the bias current to the first pulse generating circuit is provided independently of a path for supplying the bias current to the second pulse generating circuit.

4. The superconducting circuit as claimed in claim 1, wherein one of the threshold value of the first Josephson junction and the threshold value of the second Josephson junction has an absolute value larger than an amplitude of the alternating-current output generated by the secondary-side inductor.

5. The superconducting circuit as claimed in claim 1, wherein one of the first pulse generating circuit and the second pulse generating circuit is used alone to generate a pulse signal.

* * * * *